(12) United States Patent
Takamura et al.

(10) Patent No.: US 7,510,886 B2
(45) Date of Patent: Mar. 31, 2009

(54) METHOD OF MANUFACTURING SEMICONDUCTOR PHOTODETECTOR

(75) Inventors: Fumio Takamura, Fujimino (JP); Haruo Fukawa, Fujimino (JP)

(73) Assignee: New Japan Radio Co., Ltd., Tokyo (JP)

( * ) Notice: Subject to any disclaimer, the term of this patent is extended or adjusted under 35 U.S.C. 154(b) by 365 days.

(21) Appl. No.: 11/480,927

(22) Filed: Jul. 6, 2006

(65) Prior Publication Data
US 2007/0026563 A1    Feb. 1, 2007

(30) Foreign Application Priority Data
Jul. 7, 2005    (JP)    ............................ 2005-198649

(51) Int. Cl.
*H01L 21/00*    (2006.01)
(52) U.S. Cl. ................... 438/22; 438/25; 257/E31.121
(58) Field of Classification Search ................ 438/22, 438/24, 25, 26, 27, 69, 70; 257/E31.121
See application file for complete search history.

(56) References Cited
FOREIGN PATENT DOCUMENTS
JP    05203940 A  *  8/1993
JP    9-15044       1/1997

* cited by examiner

*Primary Examiner*—Hoai V Pham
(74) *Attorney, Agent, or Firm*—Antonelli, Terry, Stout & Kraus, LLP.

(57) ABSTRACT

A method of manufacturing a semiconductor photodetector having spectral sensitivity close to relative luminous characteristics at low cost includes steps of sealing a light receiving surface side of a semiconductor light receiving element having high spectral sensitivity in wavelengths from the visible light region to infrared region with a sealing resin, a semiconductor photodetector is made by preparing dispersion liquid by dispersing micro particles having infrared blocking characteristics not more than 100 nm in toluene, preparing a sealing resin by mixing the dispersion liquid in a transparent resin, sealing the semiconductor light receiving element with the resin, removing toluene in the sealing resin by defoaming and hardening sealing resin thereafter.

2 Claims, 9 Drawing Sheets

| Mixing ratio = 5wt% | |
|---|---|
| Transparent epoxy resin | KHF-7A diffusion liquid |
| 50g | 2.5g |

Transparent epoxy resin : 1 liquid type epoxy resin
KHF-7A diffusion liquid : diffusion liquid with 95% of toluene, 5% of $LaB_6$ micro particles (b)

| Sample No. | Sealing resin | Substrate (g) | After application (g) | Application quantity (g) | Vacuum heating defoamation | | | Resin hardening | | |
|---|---|---|---|---|---|---|---|---|---|---|
| | | | | | After defoamation (g) | Decreased quantity (g) | Evaporated quantity (g) | After hardened (g) | Decreased quantity (g) | Evaporated quantity (g) |
| 1 | Transparent epoxy resin | 4.96 | 7.58 | 2.62 | 7.61 | -0.03 | -1.145038 | 7.32 | 0.26 | 9.9236641 |
| 2 | | 4.93 | 7.22 | 2.69 | 7.20 | 0.02 | 0.8733624 | 6.91 | 0.31 | 13.537118 |
| 3 | | 4.85 | 7.23 | 2.38 | 7.20 | 0.03 | 1.2605042 | 6.93 | 0.30 | 12.605042 |
| 4 | | 4.87 | 7.25 | 2.38 | 7.20 | 0.05 | 2.1008403 | 6.96 | 0.29 | 12.184874 |
| 5 | | 4.88 | 7.23 | 2.35 | 7.20 | 0.03 | 1.2765957 | 6.97 | 0.26 | 11.063830 |
| 6 | KHF-7A mixed resin | 4.90 | 7.23 | 2.33 | 7.09 | 0.14 | 6.0085837 | 6.82 | 0.41 | 17.596567 |
| 7 | | 4.93 | 7.20 | 2.27 | 7.07 | 0.13 | 5.7268722 | 6.82 | 0.38 | 16.740088 |
| 8 | | 4.88 | 7.18 | 2.30 | 7.02 | 0.16 | 6.9565217 | 6.78 | 0.40 | 17.391304 |
| 9 | | 4.85 | 7.18 | 2.33 | 7.05 | 0.13 | 5.5793991 | 6.79 | 0.39 | 16.738197 |
| 10 | | 4.90 | 7.18 | 2.28 | 7.04 | 0.14 | 6.1403509 | 6.84 | 0.34 | 14.912281 |

(c)

Transition of evaporated quantity of transparent epoxy resin (%)

| Sample No. | After defoamation | After hardened |
|---|---|---|
| 1 | -1.15 | 9.92 |
| 2 | 0.87 | 13.54 |
| 3 | 1.26 | 12.61 |
| 4 | 2.10 | 12.18 |
| 5 | 1.28 | 11.06 |
| Max | 2.10 | 13.54 |
| Min | -1.15 | 9.92 |
| Ave | 0.87 | 11.86 |

(rounded by three decimal point)

Transition of evaporated quantity of KHF-7A mixed resin (%)

| Sample No. | After defoamation | After hardened |
|---|---|---|
| 6 | 6.01 | 17.60 |
| 7 | 5.73 | 16.74 |
| 8 | 6.96 | 17.39 |
| 9 | 5.58 | 16.74 |
| 10 | 6.14 | 14.91 |
| Max | 6.96 | 17.60 |
| Min | 5.58 | 14.91 |
| Ave | 6.08 | 16.68 |

(rounded by three decimal point)

|  | Transparent epoxy resin (Ave) | KHF-7A mixed resin (Ave) |
|---|---|---|
| Initial stage | 100 | 100 |
| After defoamation | 99.13 | 93.92 |
| After hardened | 88.14 | 83.32 |

Vacuum heating-defoamation condition : 2.6kPa, 55°C, 1hour
Hardening condition : 80°C × 6hours + 150°C × 2hours

US 7,510,886 B2

METHOD OF MANUFACTURING SEMICONDUCTOR PHOTODETECTOR

BACKGROUND OF THE INVENTION

The present invention relates to methods for manufacturing a semiconductor photodetector whose spectral sensitivity is controlled to the visible light region.

As a photodetector, a CdS cell having spectral sensitivity characteristics as shown in FIG. 6 has been widely used. However, since cadmium is high in environmental burdens and falls under a controlled substance by RohS command of EU, cadmium will be prohibited to use within EU from July 2006. As a replacement of cadmium, a photodetector formed from silicon has been used. In order to compose a photodetector with a silicon phototransistor, spectral sensitivity characteristics of silicon (FIG. 7) needs to be coordinated with relative luminous characteristics (FIG. 8) which is sensitivity of human eyes.

In order to achieve this, conventionally, after fabricating a silicon light receiving element, an optical thin film filter composed of multiple thin films in which an oxide silicon ($SiO_2$) film and a titanium oxide ($TiO_2$) film are alternatively laminated has been provided at a light receiving surface of a silicon light receiving element within a vacuum plasma evaporating apparatus in an optical multiple thin film evaporation step 31 as shown in FIG. 9. The silicon light receiving element is adhered to a substrate in a die bonding step 32, and a wire is connected between the silicon light receiving element and a pad of the substrate in a wire bonding step 33. The silicon light receiving element is then sealed by a transparent resin in a transfer molding step 34 and is cut into individual semiconductor photodetectors in a separating step 35.

By the above-mentioned arrangement, spectral sensitivity of the infrared region within the spectral sensitivity of silicon is decreased by the optical thin film filter such that entire sensitivity can be approximated to relative luminous characteristics (FIG. 8) (see, for example Japanese Unexamined Patent Publication No. 15044/1997).

However, formation of an optical thin film filter of the multilayer thin film formed by alternatively laminating an oxide silicon ($SiO_2$) film and a titanium oxide ($TiO_2$) film is a troublesome task in terms of time and processes and results in high cost. In other words, the multilayer thin film is formed by multiple times of vacuum plasma evaporation, and a bonding pad is etched to be open for electrical connection after the formation of the multilayer film. These processes require special techniques in addition to the time consuming processes thus resulting in high cost.

An object of the present invention is to provide methods for manufacturing a semiconductor photodetector having spectral sensitivity characteristics close to relative luminous characteristics at low cost.

SUMMARY OF THE INVENTION

In order to solve the above-mentioned problems, a method for manufacturing a semiconductor photodetector of the invention includes steps of sealing at least a light receiving surface side of a semiconductor light receiving element having high spectral sensitivity in wavelengths from at least a visible light region to infrared region with a sealing resin, comprising steps of: preparing a dispersion liquid including boride of one or more elements selected from La, Pr, Nd, Ce, Y, Ti, Zr, Hf, V, Nb, Ta, Cr, Mo or W, ruthenium oxide or iridium oxide of micro particles whose particle diameter is not more than approximately 100 nm are dispersed therein by a solvent: preparing the sealing resin by mixing the prepared dispersion liquid with a transparent resin; sealing the semiconductor light receiving element by the prepared sealing resin; and removing the solvent in the sealing resin.

The method for manufacturing a semiconductor photodetector of the invention also includes steps of sealing at least a light receiving surface side of a semiconductor light receiving element having high spectral sensitivity in wavelengths from at least a visible light region to infrared region with a sealing resin, comprising steps of: preparing a dispersion liquid including boride of one or more elements selected from La, Pr, Nd, Ce, Y, Ti, Zr, Hf, V, Nb, Ta, Cr, Mo or W, ruthenium oxide or iridium oxide of micro particles whose particle diameter is not more than approximately 100 nm are dispersed therein by a solvent: mixing the prepared dispersion liquid with a base resin of a transparent resin of a two liquid type; removing the solvent in the mixed transparent resin; preparing the sealing resin by mixing a hardening agent of a transparent resin of a two liquid type with the transparent resin in which the solvent is removed; and sealing the semiconductor light receiving element by the prepared sealing resin.

It should be noted that the removal of the solvent is preferably performed by vacuum heating to the extent the resin is not hardened.

According to methods for manufacturing a semiconductor photodetector of the present invention, sealing resin in which micro particles having infrared blocking characteristics are dispersed is used to enhance effects of a filter. Therefore, fabrication becomes simpler compared to that of a conventional method in which effects of a filter is enhanced by forming multiple films, thereby fabrication can be achieved at low cost. Furthermore, a solvent of a dispersion liquid in which micro particles are dispersed is processed to be removed prior to hardening of the resin, thereby a situation such as an occurrence of cracks in the sealing resin as a package can be prevented in a reflow soldering process for mounting a fabricated semiconductor photodetector. The semiconductor photodetector of the present invention can be widely used as a detector for controlling liquid crystal backlight of such as portable devices (such as cellular phones and PDA) and personal computers, for controlling automatic lighting of such as house light and security light, for controlling electric flash of cameras or for controlling other devices.

BRIEF DESCRIPTION OF THE DRAWINGS

FIGS. 4(*a*) to 4(*c*) are illustration views showing measurement results in manufacturing processes in the cases sealing resin mixed with dispersion liquid is used and sealing resin not mixed with dispersion liquid is used;

DETAILED DESCRIPTION

Figure 7:
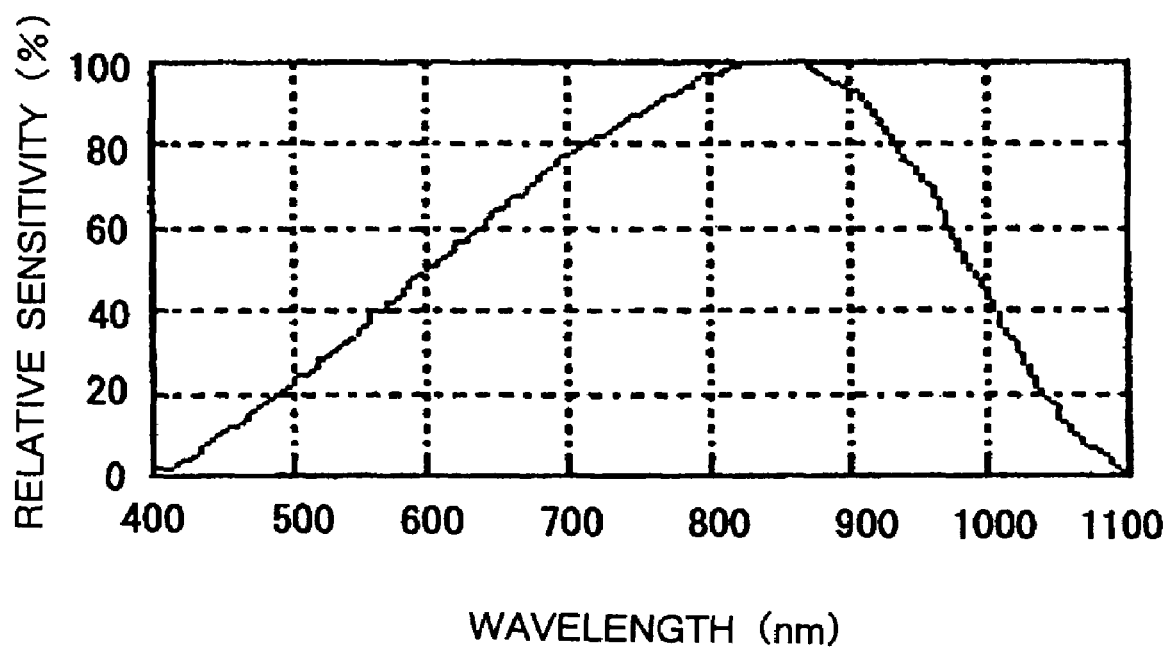
FIG. 7 is a diagram showing spectral sensitivity characteristics of a silicon phototransistor.
Figure 8:
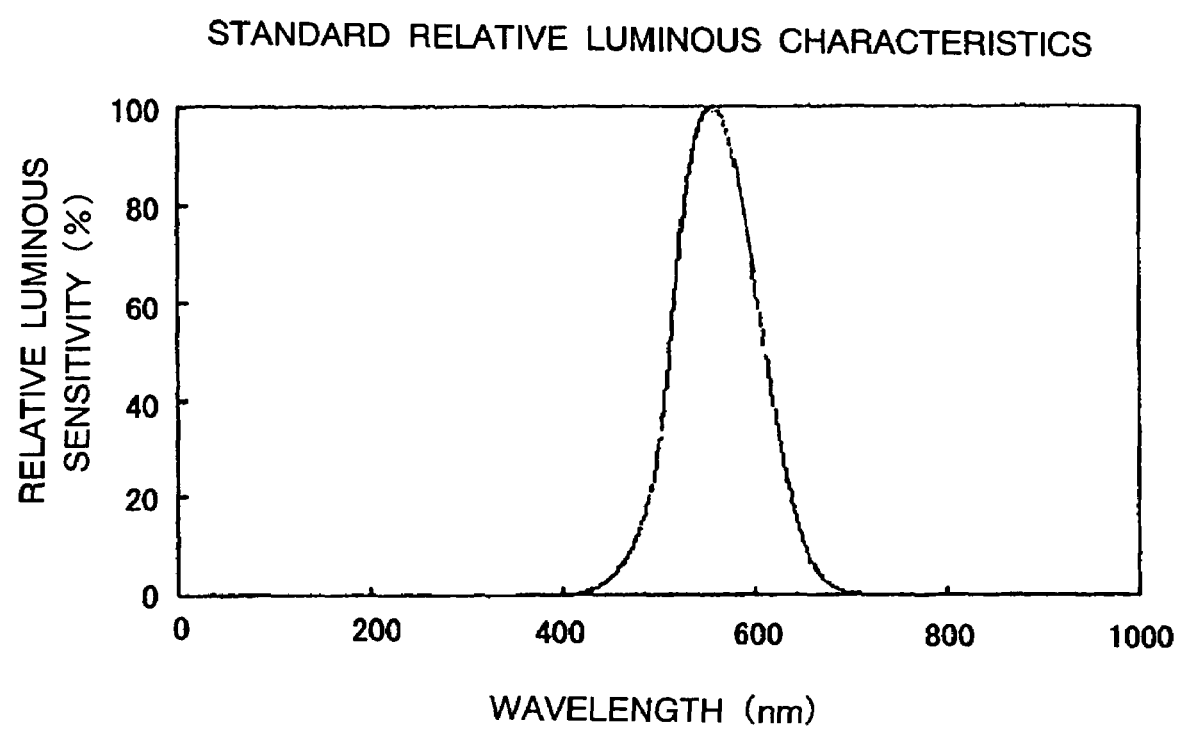
FIG. 8 is a diagram showing standard relative luminous characteristics.
Figure 9:
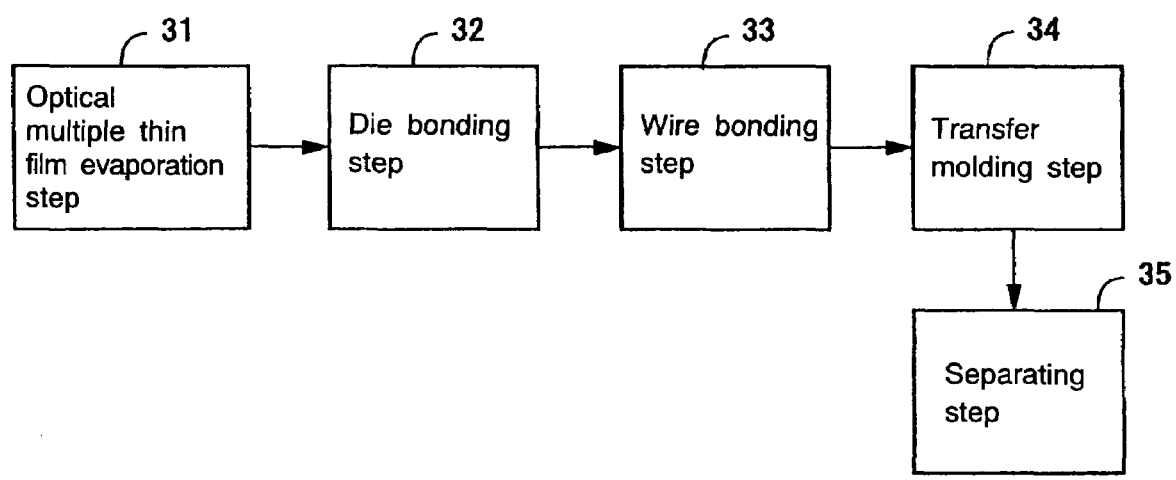
FIG. 9 is a flow chart showing a manufacturing method of a conventional semiconductor photodetector.

In the present Example, a semiconductor light receiving element is composed of a compound semiconductor such as silicon or gallium arsenide, gallium phosphide, indium phosphide, and a material with high spectral sensitivity at least from the visible light region to the infrared region (a material with characteristics shown in FIG. 7) is used. As a resin for sealing a light receiving surface of the semiconductor light receiving element, a transparent sealing resin (for example an epoxy resin) in which micro particles of such as lanthanum boride ($LaB_6$) whose particle diameter is not more than approximately 100 nm are dispersed is used.

A reason for selecting such as lanthanum boride is that it has high light blocking characteristics for wavelengths in the infrared region compared to other metal oxide. When fluorescent light or sunlight enters inside a sealing resin in which micro particles of lanthanum boride are dispersed and encounters lanthanum boride, electromagnetic waves at frequencies lower than plasma frequencies of lanthanum boride cause total reflection. Hereat, plasma frequency is the number of frequency of free electrons generated by loose density of electron distribution of a solid substance. Electromagnetic waves in higher frequency than the frequency of plasma frequency pass through and electromagnetic waves in lower frequency are totally reflected. In the case of lanthanum boride, wavelengths of frequency causing total reflection are present in the infrared region.

A reason for selecting micro particles whose particle diameter is not more than approximately 100 nm is to suppress visible light (wavelengths between 400 to 700 nm) to be reflected by scattering. In other words, when a particle diameter of a micro particle is less than the wavelengths of visible light, light scattering by the micro particle becomes mainly Rayleigh scattering. The scattering enlarges in proportion to the square of the particle volume, namely the sextuplicate of the particle diameter. Therefore, a smaller particle diameter results in a sharp reduction in scattering, thereby transparency relative to the visible light is increased. The high transparency relative to visible light can be obtained by particle diameters less than ¼ of the wavelengths of visible light (approximately less than 100 nm).

As described above, micro particles such as lanthanum boride ($LaB_6$) whose particle diameter is not more than approximately 100 nm have particular characteristics that block light at wavelengths in the infrared region and transmit light in the visible light region whose wavelengths are shorter than that of the infrared region when micro particles are dispersed in the transparent resin.

As micro particles with infrared blocking characteristics which is dispersed in the transparent resin, boride micro particles of such as praseodymium boride ($PrB_6$), neodymium boride ($NdB_6$), cerium boride ($CeB_6$), yttrium boride $YB_6$), titanium boride ($TiB_2$), zirconium boride ($ZrB_2$), hafnium boride ($HfB_2$), vanadium boride ($VB_2$), tantalum boride ($TaB_2$), chromium boride ($CrB$, $CrB_2$), molybdenum boride ($MoB_2$, $Mo_2B_5$, $MoB$) or tungsten boride ($W_2B_5$) are typically used besides the above-mentioned lanthanum boride ($LaB_6$), and one or two or more of those can be used.

Furthermore, instead of those boride micro particles or in addition to those boride micro particles, ruthenium oxide micro particles or iridium oxide micro particles may be added. Typical examples of oxide micro particles are micro particles of ruthenium dioxide ($RuO_2$), lead ruthenate ($Pb_2Ru_2O_{6.5}$), bismuth ruthenate ($Bi_2Ru_2O_7$), iridium dioxide ($IrO_2$), bismuth iridate ($Bi_2Ir_2O_7$) and lead iridate ($Pb_2Ir_2O_{6.5}$). Micro particles of ruthenium oxide or iridium oxide are stable oxide, have a large amount of free electrons and are high in blocking characteristics of the infrared region.

The above-described boride micro particles and oxide micro particles are also superior in heat resistance. Therefore, degradation of blocking characteristics of infrared light is not recognized in the case heat is applied for a reflow soldering process which is required to mount a semiconductor device.

EXAMPLE 1

Figure 1:
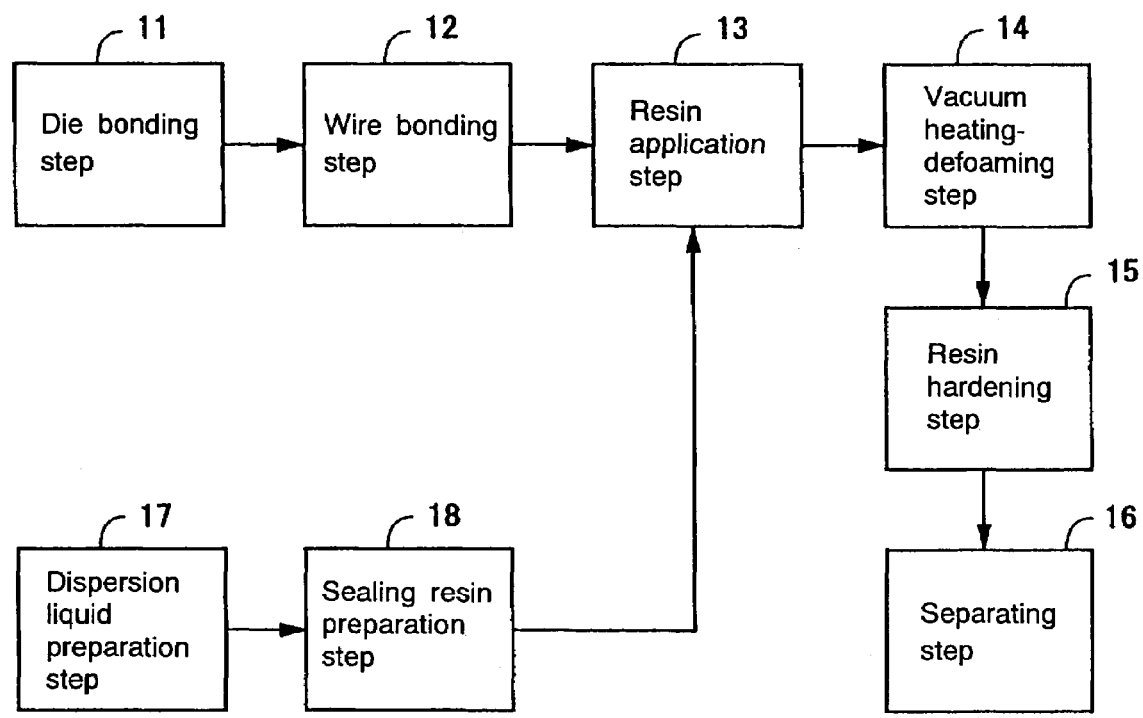
FIG. 1 is a flow chart showing a manufacturing method of a semiconductor photodetector of Example 1.
Figure 3:
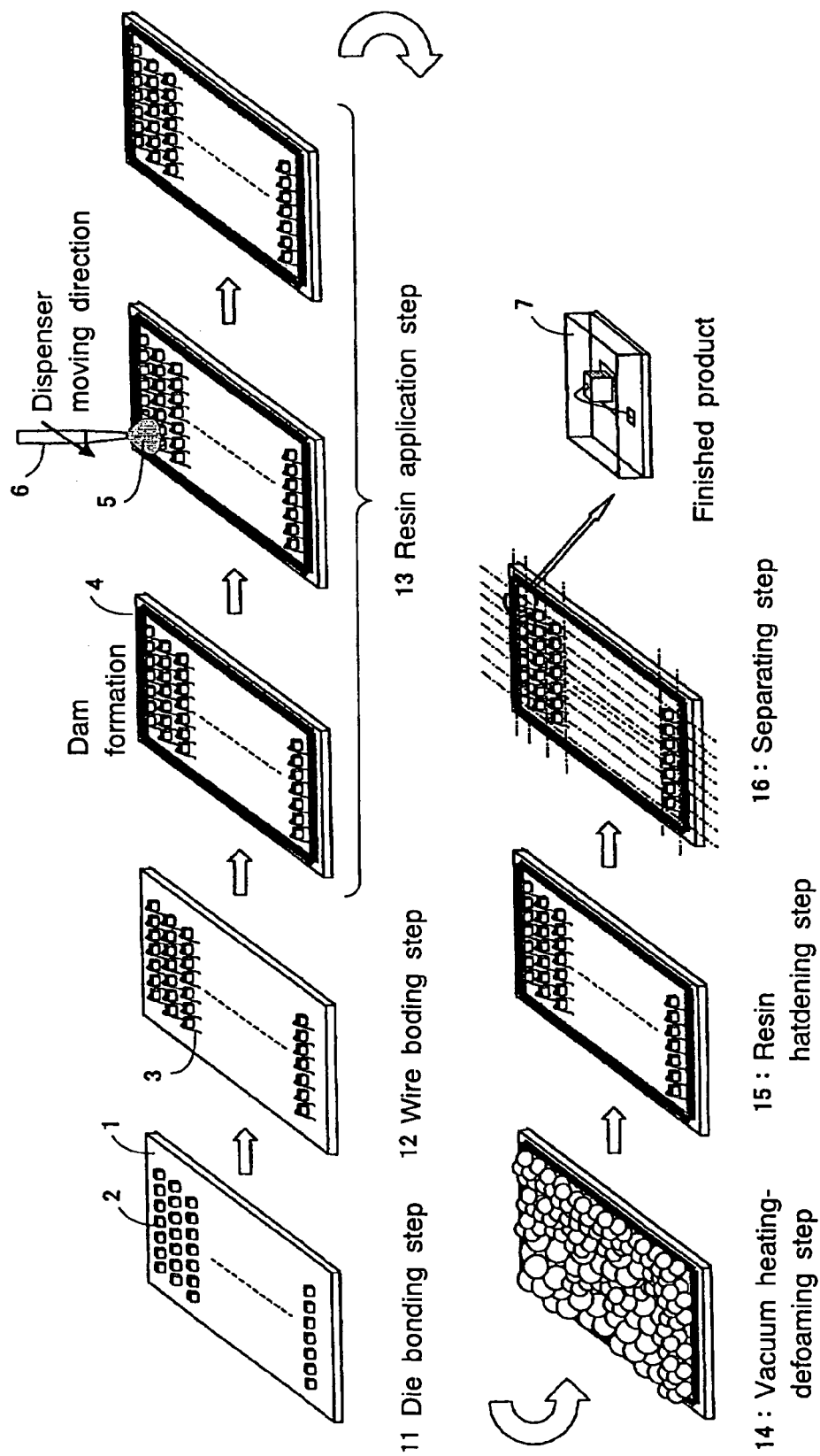
FIG. 3 is an illustration view showing a manufacturing method according to Example 1.

FIG. 1 is a flow chart showing a manufacturing method of a semiconductor photodetector of Example 1 and FIG. 3 is an illustration view thereof. In a die bonding step 11, a plurality of chips 2 of the semiconductor light receiving element is placed in a given distance and adhered to an integrated substrate 1 to be a base of a package. Each chip 2 is connected to the integrated substrate 1 by a wire 3 in a wire bonding step 12. As shown in FIG. 3, the periphery of a top surface of the integrated substrate 1 is entirely enclosed by a dam 4 in a resin application step 13, and premanufactured sealing resin 5 is applied thereon with a dispenser 6 to collectively seal the plurality of chips 2 by the resin.

The preparation of the sealing resin 5 used in the resin application step 13 will now be explained. In a dispersion liquid preparation step 17, 5% by weight of the micro particles of lanthanum boride is dispersed in toluene to prepare dispersion liquid (KHF-7A dispersion liquid: manufactured by Sumitomo Metal Mining Co., Ltd., insolation blocking dispersion liquid—95 wt % of toluene, 5 wt % of $LaB_6$) having infrared blocking characteristics. A surface active agent or coupling agent may be added as required at this time. The dispersion liquid is agitated and mixed by being added to a transparent epoxy resin of one liquid type to prepare the transparent sealing resin 5 in a sealing resin preparation step 18. The agitation is performed approximately 10 minutes by for example a commercially available automatic agitating-defoaming device.

In a vacuum heating-defoaming step 14, a vacuum heating-defoaming process is performed for an hour at 2.6 kPa, 55° C. By the vacuum heating-defoaming step 14, void taken in the sealing resin 5 and toluene being a solvent of the dispersion liquid are evaporated to an extent that the sealing resin 5 is not hardened.

A resin hardening process is performed in a following resin hardening step 15. The resin hardening process including two stages is performed for 6 hours at 80° C. and 2 hours at 150° C. Hereat, the minimum condition of the first stage is a condition in which toluene which has not been expelled in the vacuum heating-defoaming step 14 is positively removed from the sealing resin. In case toluene remains within the sealing resin of a finished product, there is a probability that a crack may occur in a package in the reflow soldering process.

Finally, final products of individual semiconductor photodetectors are obtained by cutting in a separating process 16.

The inventors of the present invention have prepared five samples of the sealing resin 5 in which only transparent epoxy resin (liquid resin of bisphenol-A) is used as the transparent resin 5 and five samples of the sealing resin 5 in which 2.5 g of KHF-7A dispersion liquid (95% of toluene and 5% of micro particles of lanthanum boride) being mixed into 50 g of transparent epoxy resin is used as the sealing resin. The respective samples are sealed by a resin. The result is shown in FIG. 4.

FIG. 4(a) shows used materials, FIG. 4(b) shows measured weights in each step and FIG. 4(c) shows a comparison of change in the evaporated quantity of the transparent epoxy resin and KHF-7A mixed resin. "Substrate" represents an integrated substrate on which die bonding and wire bonding are performed. For example, "application quantity" of the KHF-7A mixed resin is 2.33 g in sample No. 6 of FIG. 4(b), and the quantity of toluene at this time is 2.33×5%×95%=0.110675 g. Relative to this, the quantity of toluene is decreased by 0.14 g from 2.33 g by the vacuum heating defoamation and is finally decreased by 0.41 g from 2.33 g to confirm the decrease in excess of the quantity of toluene.

Figure 5:
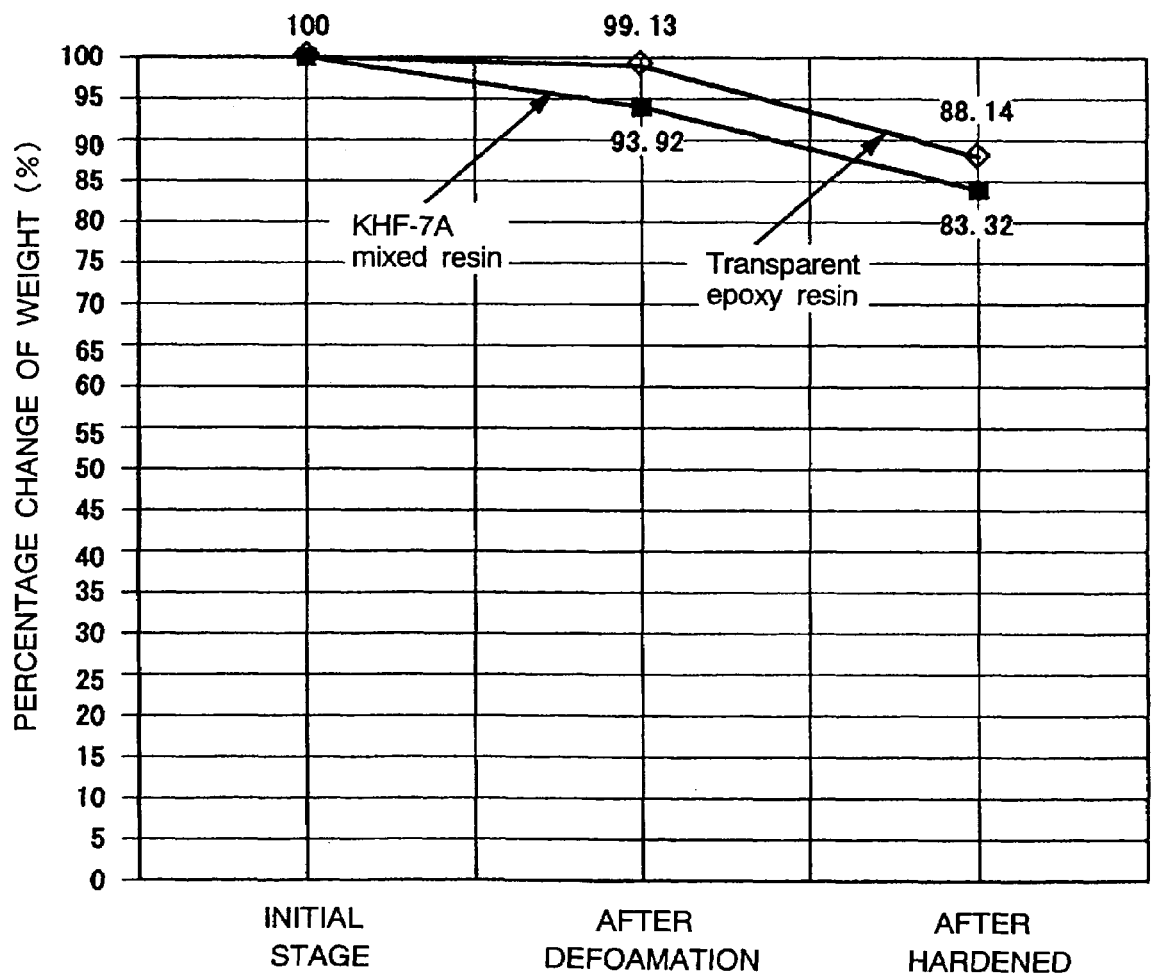
FIG. 5 is a characteristic diagram in which contents of "Ave" in FIG. 4(*c*) are shown in a graph.
Figure 6:
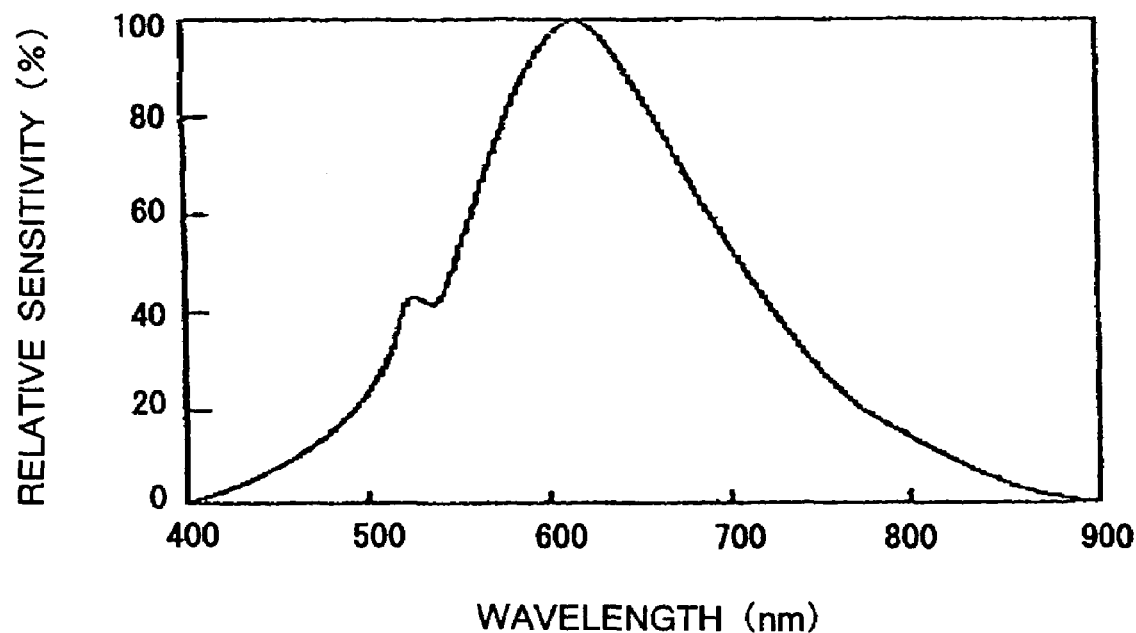
FIG. 6 is a diagram showing spectral sensitivity characteristics of CdS.

FIG. 5 is a graph showing values in "Ave" of FIG. 4(c). It is clearly confirmed that toluene is removed by the vacuum heating-defoaming step.

EXAMPLE 2

Figure 2:
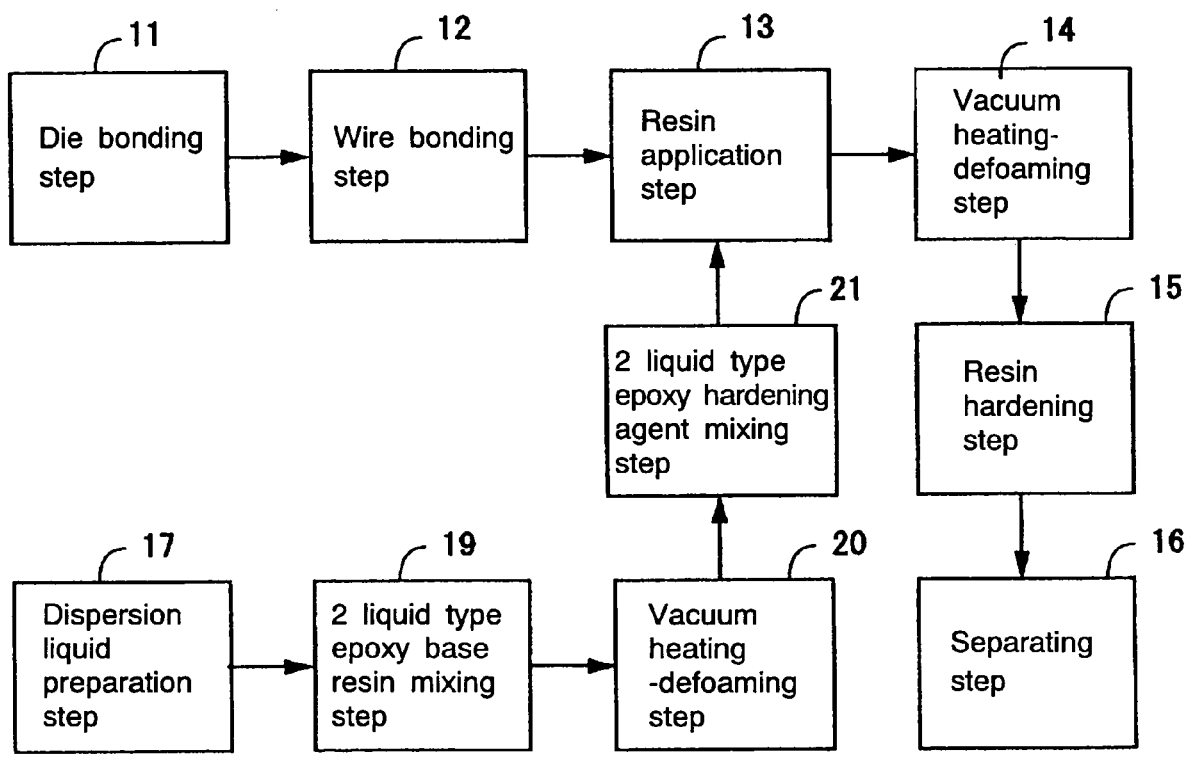
FIG. 2 is a flow chart showing a manufacturing method of a semiconductor photodetector of Example 2.

FIG. 2 is a flow chart showing a method of manufacturing a semiconductor photodetector of Example 2. Example 2 is different from Example 1 in that epoxy resin of a two liquid type including a base resin and a hardening agent is used as the sealing resin. In the case of using the epoxy resin of the two liquid type as the transparent resin, the dispersion liquid is added to the base resin to be mixed in a mixing step 19 of epoxy base resin of two liquid type. The mixed resin is processed by vacuum heating defoaming in a vacuum heating-defoaming step 20 to remove toluene. Then, the sealing resin is prepared by mixing the hardening agent in a mixing step 21 of epoxy hardening agent of two liquid type. In the process, it is possible to omit the vacuum heating-defoaming process 15. However, it is desirably to adopt the step in view of complete removal of toluene and removal of void.

What is claimed is:

1. A method for manufacturing a semiconductor photodetector by sealing at least a light receiving surface side of a semiconductor light receiving element having high spectral sensitivity in wavelengths from at least a visible light region to infrared region with a sealing resin, comprising steps of:

preparing a dispersion liquid including boride of one or more elements selected from La, Pr, Nd, Ce, Y, Ti, Zr, Hf, V, Nb, Ta, Cr, Mo or W, ruthenium oxide or iridium oxide of micro particles whose particle diameter is not more than approximately 100 nm are dispersed therein by a solvent:

preparing said sealing resin by mixing said prepared dispersion liquid with a transparent resin;

sealing said semiconductor light receiving element by said prepared sealing resin; and removing said solvent in said sealing resin.

2. The method for manufacturing a semiconductor photodetector according to claim 1, wherein removal of said solvent is performed by vacuum heating to an extent that said resin is not hardened.

* * * * *